United States Patent [19]
Steele

[11] Patent Number: 5,867,510
[45] Date of Patent: Feb. 2, 1999

[54] METHOD OF AND APPARATUS FOR DECODING AND PROCESSING MESSAGES

[75] Inventor: Scott A. Steele, Lindenhurst, Ill.

[73] Assignee: Motorola, Inc., Schaumburg, Ill.

[21] Appl. No.: 866,562

[22] Filed: May 30, 1997

[51] Int. Cl.[6] ............................................. H03M 13/00
[52] U.S. Cl. .................... 371/37.7; 370/314; 371/37.02
[58] Field of Search ............................... 371/37.7, 37.02; 370/314

[56] References Cited

U.S. PATENT DOCUMENTS

| | | | |
|---|---|---|---|
| 4,750,178 | 6/1988 | Sako et al. | 371/37 |
| 4,785,451 | 11/1988 | Sako et al. | 371/37 |
| 4,819,231 | 4/1989 | Yamada | 370/94 |
| 5,351,245 | 9/1994 | Pregont et al. | 371/5.1 |
| 5,384,786 | 1/1995 | Dudley et al. | 371/37.1 |
| 5,471,503 | 11/1995 | Altmaier et al. | 375/202 |
| 5,471,655 | 11/1995 | Kivari | 455/127 |
| 5,491,688 | 2/1996 | Bocci et al. | 370/18 |
| 5,539,755 | 7/1996 | Baggen | 371/37.1 |
| 5,603,081 | 2/1997 | Raith et al. | 455/33.1 |
| 5,606,569 | 2/1997 | MacDonald et al. | 371/37.7 |
| 5,677,918 | 10/1997 | Tran et al. | 371/32 |

*Primary Examiner*—Stephen M. Baker
*Attorney, Agent, or Firm*—John J. Oskorep

[57] ABSTRACT

A mobile station (104) processes a paging message having information data mapped to a cyclical redundancy check (CRC) error detection code and divided into a plurality of CAC data portions mapped to a plurality of Bose-Chaudhuri-Hocquenghem (BCH) error correction codes. A BCH forward error corrector (FEC) (150) generates a plurality of BCH syndromes (538) to correct single errors that may exist in each of the plurality of CAC data portions (402), and thereby generates a plurality of post-correction CAC data portions (504). A cyclical redundancy check (CRC) error detector (152) detects if an error exists in the plurality of post-correction CAC data portions (504). An error detector (174) detects if BCH syndromes (552–562) corresponding to post-correction CAC data portions (518–528) have values of zero. When the CRC error detector (152) detects an error and the error detector (174) detects that BCH syndromes (552–562) have values of zero, the mobile station (104) processes the paging message and performs a page response function in response to detecting a page.

38 Claims, 5 Drawing Sheets

*FIG. 8*

METHOD OF AND APPARATUS FOR DECODING AND PROCESSING MESSAGES

FIELD OF THE INVENTION

The present invention relates generally to the field of decoding and processing messages, and more particularly to the field of decoding and processing messages in a radio frequency (RF) communication system.

BACKGROUND OF THE INVENTION

A radio frequency (RF) communication system typically provides wireless communication between a base station and a mobile station. The base station often has the ability to "page" or call the mobile station, whether it be to provide the mobile station with a text or voice message or to establish a two-way voice call between a user of the mobile station and a third-party caller.

One of the most important aspects of such a system is its call completion rate. A call completion rate may be defined as $N_D/N_P$, where $N_P$ is the number of paging messages sent to and intended for the mobile station, and $N_D$ is the number of successful detections of the paging messages by the mobile station. Unfortunately, some RF communication systems may have poor call completion rates due to, for example, low received signal strengths and environmental interferences.

To improve overall quality and reliability of communication, such a system may conform to a common air interface specification that specifies an error detection code and error correction codes to be sent with information data in an encoded information unit. For example, a personal digital cellular (PDC) system adheres to a communication standard issued by the Research and Development Center for Radio Systems (RCR), now known as the Association of Radio Industries and Businesses of Japan (ARIB), under the name STD-27 (RCR STD-27, 1991). This standard outlines Bose-Chaudhuri-Hocquenghem (BCH) forward error correction (FEC) codes for correcting single errors in data portions of the information data, and a cyclical redundancy check (CRC) code for detecting remaining errors in the corrected data portions.

Conventional methods of decoding such an encoded information unit, one of which is outlined generally in the RCR STD-27, include the following steps: (1) receiving an encoded information unit; (2) generating, using the BCH FEC codes, a BCH syndrome for each data portion of the encoded information unit; (3) correcting, using the BCH syndromes, single errors that may exist in each data portion to thereby generate a post-correction information unit; (4) detecting, using the CRC code, if an error exists in the post-correction information unit; (5) processing and performing a function based on the post-correction information unit if no errors are detected therein; and (6) discarding the post-correction information unit if an error is detected therein.

While such methods and standards have generally improved communication, reliability may still be less than satisfactory since post-correction information units may often have errors and therefore are discarded and unused. If a mobile station acts upon or processes such corrupted data, it will likely respond improperly with undesirable consequences.

Furthermore, some messages, such as paging messages, are sent only once to the mobile station without retransmission by the base station. Therefore, if a paging message is corrupted over a communication channel, a page to the mobile station may be missed entirely even though the mobile station is ready and available to receive calls.

Accordingly, there is an existing need for an improved method and apparatus for detecting errors and decoding and processing messages, especially one suitable for increasing call completion rates in RF communication systems.

DETAILED DESCRIPTION OF THE PREFERRED EMBODIMENTS

According to the present invention, an apparatus comprises an error corrector, a first error detector, and a second error detector. An encoded information unit includes information data mapped to an error detection code and divided into a plurality of data portions mapped to a plurality of error correction codes. The error corrector generates a plurality of syndromes corresponding to the plurality of data portions and corrects at least one error that may exist in each of the plurality of data portions, thereby generating a plurality of post-correction data portions. The first error detector detects if an error exists in the plurality of post-correction data portions. The second error detector detects if at least a first post-correction data portion is error-free by testing at least a first syndrome corresponding to the at least a first post-correction data portion.

Figure 1:
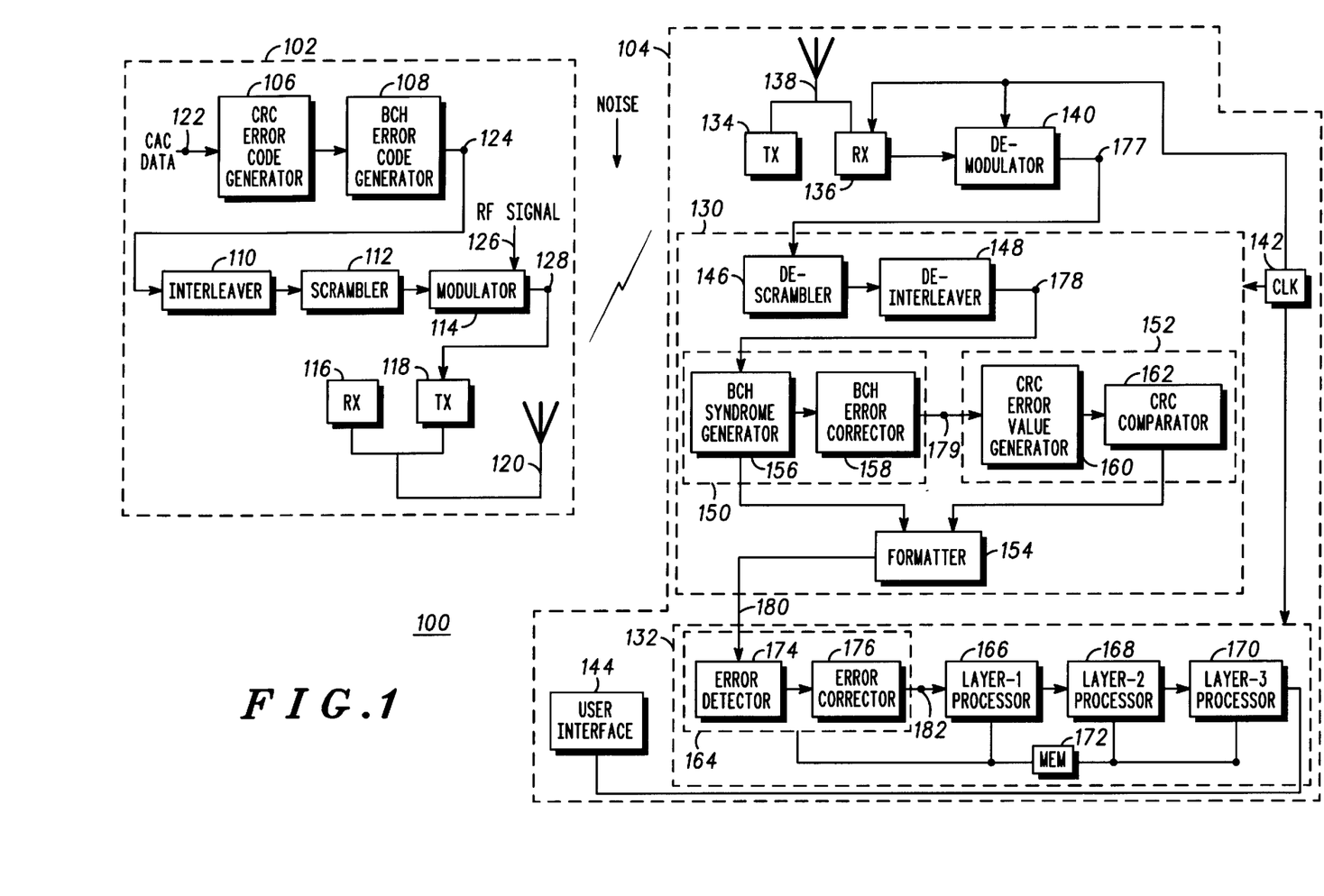
FIG. 1 is a schematic diagram of a communication system including a base station and a mobile station.

FIG. 1 is a schematic block diagram of a communication system 100 that includes a base station 102 and a mobile station 104. Base station 102 and mobile station 104 communicate via radio frequency (RF) signals, and may provide a number of communication services such as speech communication, data communication (G3-facsimile, modem, videotex), and short message service. Mobile station 104 may be referred to as a radio communication device. Preferably, mobile station 104 is a cellular telephone at least providing telephone or telephone-like communications.

Communication system 100 is designed to operate in accordance with predefined standards and specifications, including a common air interface specification. In the preferred embodiment described herein, communication system 100 is a personal digital cellular (PDC) system operating in accordance with the RCR STD-27, or the more recent RCR STD-27D. PDC systems are used throughout the country of Japan and are designed using time division multiple access (TDMA)/frequency division duplex (FDD) schemes. A copy of the RCR STD-27 may be obtained from the ARIB, 1-5-16 Toranomon, Minato-Ku, Tokyo 105 Japan.

Base station 102 and mobile station 104 also communicate in accordance with the International Standards Organization/open systems interconnection (ISO/OSI) model. The ISO/OSI model defines seven layers, three of which are utilized for radio communication: Layer 1 processing, the physical layer; Layer 2 processing, the data link layer; and Layer 3 processing, the network layer.

Base station 102 comprises a cyclical redundancy check (CRC) error detection code generator 106, a Bose-Chaudhuri-Hocquenghem (BCH) error correction code generator 108, an interleaver 110, a scrambler 112, a modulator 114, a receiver 116, a transmitter 118, and an antenna 120. Mobile station 104 comprises a digital signal processor (DSP) 130, a microprocessor 132, a transmitter 134, a receiver 136, an antenna 138, a demodulator 140, a clock source 142, and a user interface 144.

DSP 130 includes several processes which function according to an embedded software program stored therein based on a timing from clock source 142. These processes include a descrambler 146, a deinterleaver 148, a BCH forward error corrector (FEC) 150, a CRC error detector 152, and a formatter 154. BCH FEC 150 includes a BCH syndrome generator 156 and a BCH error corrector 158. CRC error detector 152 includes a CRC error value generator 160 and a CRC comparator 162. BCH FEC 150 and CRC error detector 152, as well as CRC error detection code generator 106 and BCH error correction code generator 108 of base station 102, are designed substantially in accordance with error correction and detection schemes well-known in the art. Preferably, DSP 130 is a DSP1629, manufactured by the American Telephone and Telegraph Company (AT&T).

Microprocessor 132 also includes several processes which function according to an embedded software program stored therein based on a timing of clock source 142. These processes include a decoder 164, a layer-1 processor 166, a layer-2 processor 168, and a layer-3 processor 170. Decoder 164 includes an error detector 174 and an error corrector 176. Microprocessor 132 also includes a memory 172 which has data stored therein. The data include correction data and unique Mobile Station Identifier (MSI) data. The unique MSI data are unique identification data associated with mobile station 104. Preferably, microprocessor 132 is an MC68338 microprocessor, manufactured by Motorola, Inc.

Layer 1 processing in accordance with the ISO/OSI model is performed by the processes in DSP 130, and by decoder 164 and layer-1 processor 166 of microprocessor 132. Layer 2 processing is performed by layer-2 processor 168, and Layer 3 processing is performed by layer-3 processor 170. "Processor" is used herein to refer to subprocessors or software processes within microprocessor 132 or DSP 130, but may be used generally to refer to a stand-alone processor such as microprocessor 132 or DSP 130.

User interface 144 may include a keypad, a speaker, a microphone, and a display (not shown). The keypad is typically used for initiating telephone calls through base station 102. The display is used to display and verify keypresses from the keypad and to display caller ID information from a calling party. When a page or call is initially received, mobile station 104 may provide an audible alert signal from the speaker. During voice communication, mobile station 104 provides audible voice signals from the speaker and accepts audible voice signals from the microphone.

Figure 2:
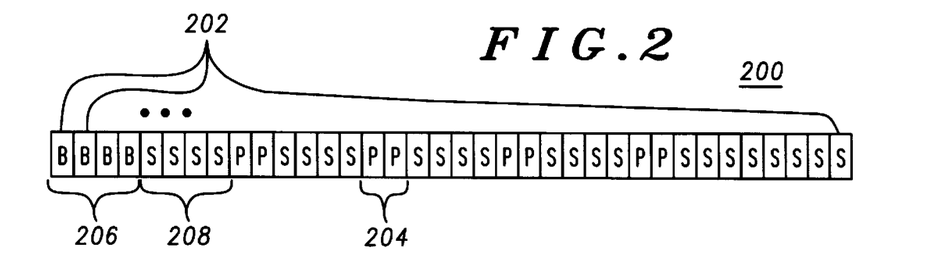
FIG. 2 is a visual representation of a superframe of a control channel (CCH) of a personal digital cellular (PDC) system.

FIG. 2 is a visual representation of a superframe 200 of a control channel (CCH) of the PDC system. Superframe 200 includes a plurality of subframes 202. The plurality of subframes 202 includes broadcast information channel (BCCH) subframes 206, signaling control channel (SCCH) subframes 208, and one or more paging channel (PCH) subframes 204 assigned to mobile station 104 and possibly to other mobile stations. BCCH subframes 206 are downlink only and include data that describe the structure of a channel in a zone, restriction information, and peripheral zone information. SCCH subframes 208 are bidirectional (downlink and uplink) and are used for registering and setting up a call. PCH subframes 204 are downlink, and include data for paging mobile stations and informing mobile stations of changes in the channel structure. Data of each of the plurality of subframes 202 are typically transmitted in 20-milliseconds and, since there are typically 36 subframes per superframe 200, data of superframe 200 are typically transmitted in 720 milliseconds.

The data in the plurality of subframes 202 include synchronization words, which microprocessor 132 uses in conjunction with the timing of clock source 142 to synchronize to the data. Thus, under typical steady-state operating conditions, microprocessor 132 is able to determine which of the plurality of subframes 202 and data are being received and processed. Once mobile station 104 determines which channel to listen to and the structure of that channel, and then registers with base station 102, it generally only needs to receive and process data in PCH subframes 204. Microprocessor 132 may shut down receiver 136 during most of the duration of superframe 200, but turn on receiver 136 during PCH subframes 204 in anticipation of a page or call.

Figure 3:
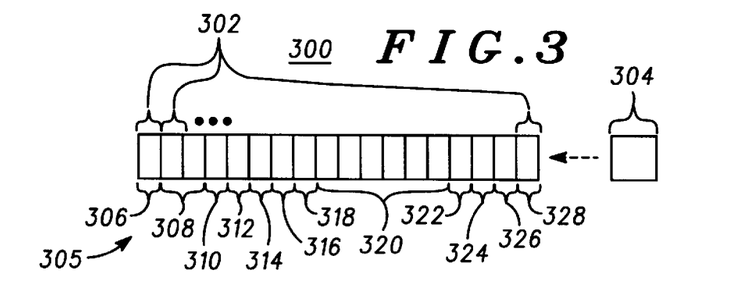
FIG. 3 is a visual representation of a control access channel (CAC) information unit of a PCH subframe.

FIG. 3 shows a visual representation of a common access channel (CAC) information unit 300 of a PCH subframe, in the case where a single mobile station is being paged. CAC information unit 300 has a substantially predetermined or predefined format and includes, in binary form, CAC information data that relate to a paging message. For example, CAC field 320 includes Mobile Station Identifier (MSI) data, which are data that uniquely identify a communication device for a page.

CAC information unit 300 has a total length of 144 bits and is shown divided into a plurality of CAC data words 302 of 8-bit length, resulting in a total number of 18 CAC data words. CAC information unit 300 may be separated into a plurality of CAC fields 305, where each CAC field includes similar and/or related data. The following table gives a brief summary of each the plurality of CAC fields 305 of a PCH subframe, as provided in the RCR STD-27D:

| Field | Field Name | Field Bits | Used To Determine |
|---|---|---|---|
| CAC field 306 | W bits | 0–7 | Info unit length |
| CAC field 308 | Address | 8–23 | Addressing type |
| CAC field 310 | Control | 24–31 | Layer-2 subframe type |
| CAC field 312 | Common Platform | 32–39 | Destination entity in layer-3 |
| CAC field 314 | RT Message Type | 40–47 | RT msg type |
| CAC field 316 | BCCH Reception Segment | 48–55 | If BCCH is changing |
| CAC field 318 | RT Number of Paging Mobile Stations (NPMS) | 56–63 | Number of stations being paged |
| CAC field 320 | Mobile Station Identifier (MSI) | 64–111 (typical) | Which station is being paged |
| CAC field 322 | Paging ID Number (PIN) | 112–119 | Number to be returned to base |
| CAC field 324 | Unused | 120–127 | Unused |

| Field | Field Name | Field Bits | Used To Determine |
|---|---|---|---|
| CAC field 326 | Unused | 128–135 | Unused |
| CAC field 328 | Unused | 136–143 | Unused |

As described earlier above, CAC information unit 300 is part of a paging message intended for a single mobile station. However, such a paging message may include pages intended for several mobile stations. The number of pages in the paging message depends on the number of PCH subframes 204 per superframe 200, as specified by data in BCCH subframes 206, and the length of the MSI data, which is variable. Although the number of PCH subframes 204 per superframe 200 is variable, it is typically one or two PCH subframes. In addition, although the length of the MSI data is variable, it is typically six bytes in length.

In a paging message of a single PCH subframe, a maximum of one mobile station can be paged (assuming 6 bytes of MSI data) since there are 18 bytes (144 bits) of data in a single PCH subframe, to which 15 bytes are used to page the mobile station (8 bytes of overhead data, 6 bytes of MSI data, and 1 byte of PIN data). Alternatively, a maximum of three mobile stations can be paged in a paging message of two PCH subframes (assuming 6 bytes of MSI data). This is true because there are 36 bytes (288 bits) of data in two PCH subframes, where 9 bytes are overhead data and 27 bytes are required for MSI data and PIN data, and where each mobile station requires 7 bytes for MSI and PIN data.

Referring back to FIGS. 1 and 3 and the table above, mobile station 104 typically receives and processes CAC information units such as CAC information unit 300. Since mobile station 104 is synchronized with the data of the plurality of subframes 202, the software within microprocessor 132 expects to process, at the appropriate time, CAC information data as defined in accordance with the plurality of CAC fields 305.

In microprocessor 132, some of the plurality of CAC fields 305 are regarded or designated as including substantially critical data. In general, substantially critical data may be data that are relatively substantially significant or important, substantially unpredictable, or both relatively substantially significant and unpredictable. On the other hand, some of the plurality of CAC fields 305 are designated or regarded as including substantially non-critical data. In general, the substantially non-critical data are data that are relatively substantially insignificant or unimportant, substantially predictable, or both relatively substantially insignificant and predictable. Such designations may be included within the embedded software program of microprocessor 132 or may be stored as data in memory 172.

Here, CAC field 320 and CAC field 322, which contain MSI data and PIN data, respectively (see table above), are regarded as including substantially critical data. CAC field 320 is regarded as substantially critical since it includes data used to identify which mobile station is being paged. Without proper MSI data, it is impossible to process the PCH subframe and an incoming page correctly. In addition, the MSI data varies dramatically and has a wide range of possible values, and thus is essentially unpredictable. CAC field 322 is also regarded as including substantially critical data since it includes data that must be sent to base station 102 after a page is received. Like data in CAC field 320, the PIN data of CAC field 322 has a wide range of possible values and is essentially unpredictable.

CAC fields 306–318 and CAC fields 324–328 are regarded as including substantially non-critical data. First, consider CAC field 306. In general, data in CAC field 306 indicate whether CAC information unit 300 is an "idle" unit (i.e., no message), whether they are a part of a longer message, and provide the number of valid bytes in CAC information unit 300. Although these data are convenient for processing the message, they are not critical. To illustrate, if the data in CAC field 306 is in error, layer-1 processor 166 can check for a majority of '0' bits to determine if CAC information unit 300 is an idle unit. In addition, layer-1 processor 166 can assume that the paging message consists of all possible PCH subframes in superframe 200, and that an end or "tail" unit is a full 18 bytes (144 bits) in length. Then, since paging messages have only a few predetermined formats, layer-3 processor 170 can easily determine the true length of the data.

Regarding the other substantially non-critical data, data in CAC field 308 generally provide information to layer-2 processor 168 for determining the type of addressing and destination MSI. These data are not critical, since messages received in PCH subframes are always broadcast messages and always contain the same address information for layer-2 processor 168. Data in CAC field 310 are used to determine the type of subframe in layer-2 processor 168, but are not critical since messages received in PCH subframes are always Unnumbered Information (UI) frames and always contain the same control information for layer-2 processor 168. Data in CAC field 312 are used to determine a destination entity in layer-3 processor 170, where the destination entity could be Radio Frequency Transmission Management (RT), Call Control (CC), or Mobility Management (MM). These data are not critical since data in PCH subframes are bound only for RT. Data in CAC field 314 are used to determine the type of RT message, but are not critical since messages in PCH subframes are always paging message types. Data in CAC field 316 are used to determine if a change in BCCH information is about to occur. These data are not critical since, if corrupted, a non-zero value (i.e., a BCCH change) may be assumed where BCCH and PCH subframes can be received until error-free data in CAC field 316 are zero (i.e., no BCCH change). Data in CAC field 318 indicate how many groups of MSI data and PIN data exist in the paging message. For a single PCH subframe, this number can only be zero or one, or at the very least is bounded by the RCR-27D standard which specifies that the number is between 0–15 (decimal), and therefore an error in the upper four bits can be tolerated. (For two PCH subframes, the maximum possible number of mobile stations being paged (three) may be assumed. Here, because paging messages are padded with data having values of zero when unused, no harm is done by attempting to process such data.) CAC fields 324, 326, and 328 are unused and thus include non-critical data.

To process CAC information unit 300 more easily and conveniently, the substantially critical data preferably include data in other CAC fields such as CAC field 306 (the W bits field) and CAC field 318 (the NPMS field).

Base station 102 (FIG. 1) generates CAC information unit 300 at a point 122 by generating CAC information data and formatting it in accordance with the plurality of CAC fields 305. Before transmission, CAC information unit 300 is processed by CRC error detection code generator 106 and BCH error correction code generator 108. Using CAC information unit 300, CRC error detection code generator 106 generates a CRC error detection code 304 having a 16-bit length and visually represented in FIG. 3. Here, CRC error detection code generator 106 uses a generator polynomial of $1+X^5+X^{12}+X^{16}$. CRC error detection code 304 is appended to CAC information unit 300 and the resulting data are divided into a plurality of CAC data portions of 10-bit length.

For each CAC data portion, BCH error correction code generator 108 generates a BCH error correction code of 4-bit length which is appended to a corresponding CAC data portion. Here, BCH error correction code generator 108 uses a 1-bit shortened BCH (14,10) for BCH (15,11) error correction code and a BCH generator polynomial of $1+X+X^4$. Each BCH error correction code allows for correction of a single bit error in a corresponding CAC data portion. A BCH generator matrix for BCH (15,11), which is generated based on the BCH generator polynomial, is used to generate these codes.

Figure 4:
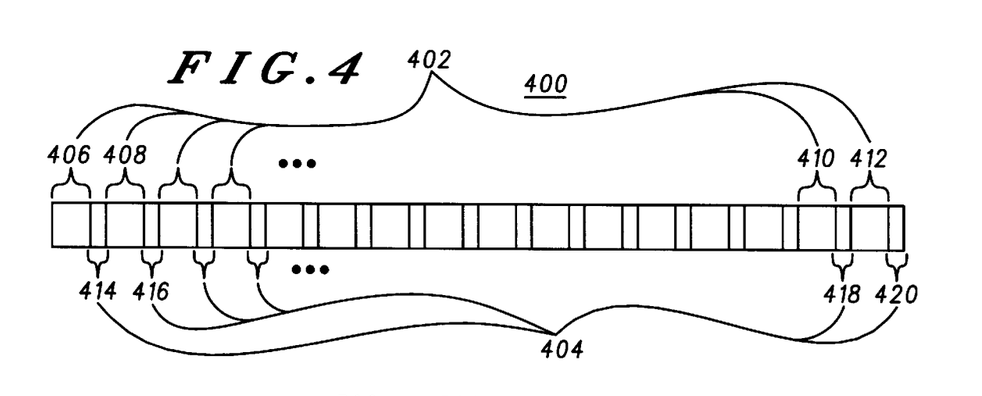
FIG. 4 is a visual representation of an encoded CAC information unit to be transmitted in the PCH subframe.

The resulting data, taken at a point 124 of FIG. 1, is an encoded CAC information unit 400 as visually represented in FIG. 4. As described above and shown, encoded CAC information unit 400 includes a plurality of CAC data portions 402 and a plurality of BCH error correction codes 404. Here, each CAC data portion has a 10-bit length and each BCH error correction code has a 4-bit length.

Each BCH error correction code corresponds to one CAC data portion. For example, a BCH error correction code 414 corresponds to a CAC data portion 406, a BCH error correction code 416 corresponds to a CAC data portion 408, a BCH error correction code 418 corresponds to a CAC data portion 410, and a BCH error correction code 420 corresponds to a CAC data portion 412. Note that data in CAC data portions 410 and 412 include CRC error detection code 304. Thus, encoded CAC information unit 400 includes CAC information data mapped to a CRC error detection code 304 and divided into a plurality of data portions 402 mapped to a plurality of BCH error correction codes 404.

Referring back to base station 102 of FIG. 1, encoded CAC information unit 400 is interleaved by interleaver 110 and scrambled by scrambler 112, thereby generating an interleaved and scrambled encoded CAC information unit. In modulator 114, this information modulates a radio frequency (RF) signal 126 to generate a modulated RF signal at a point 128. The modulated RF signal is amplified and transmitted by transmitter 118 through antenna 120 over a communication channel.

Figure 6:
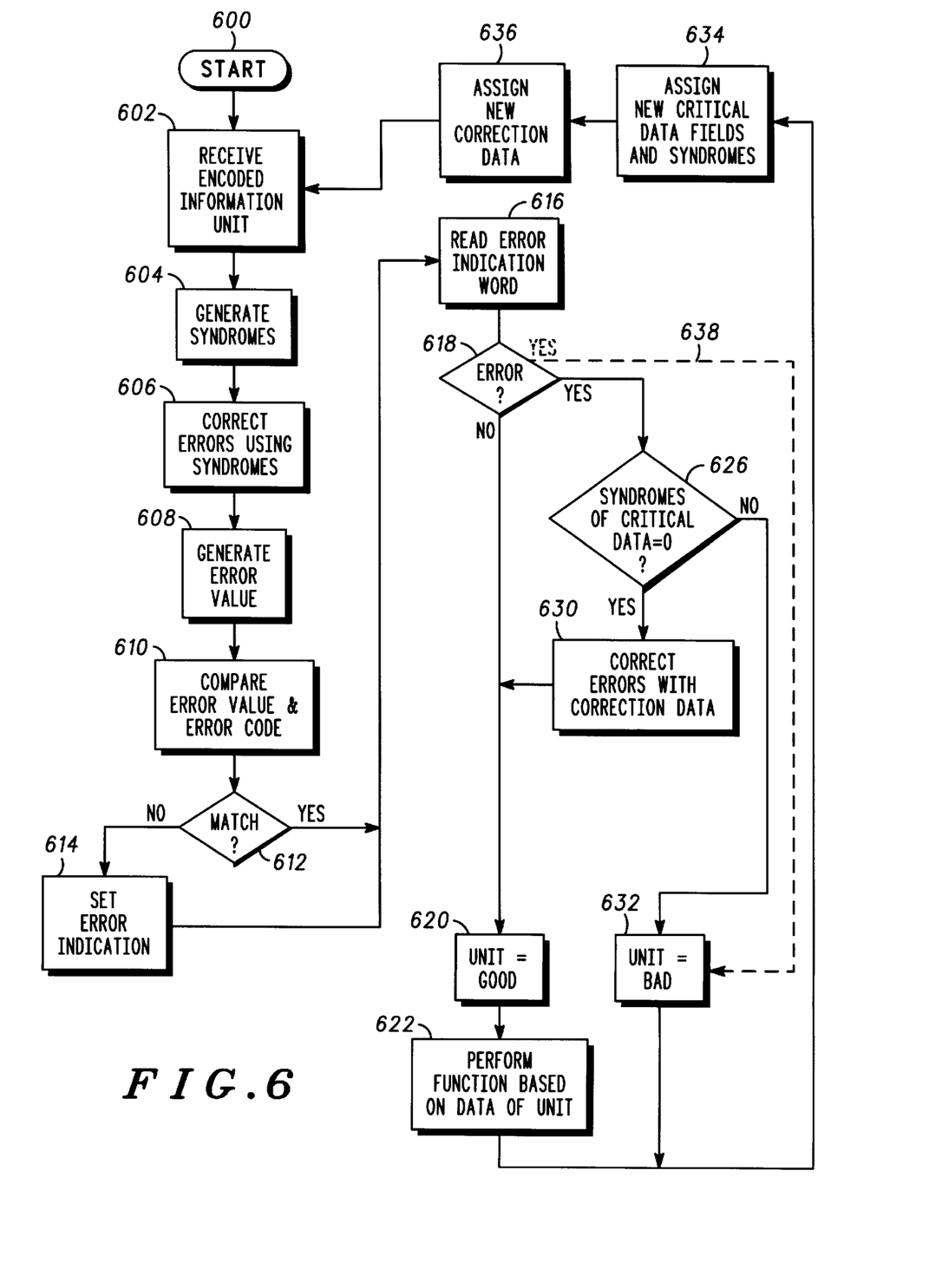
FIG. 6 is a first flowchart describing a method of detecting errors, decoding, and processing the encoded CAC information unit represented in FIG. 4.

FIG. 6 is a first flowchart describing a method of detecting errors and decoding and processing the encoded CAC information unit 400. Starting at a start block 600, mobile station 104 receives the modulated RF signal, which has the interleaved and scrambled encoded CAC information unit modulated thereon, through antenna 138 and receiver 136 (step 602). The modulated RF signal is demodulated in demodulator 140 to regenerate the interleaved and scrambled encoded CAC information unit at a point 177. The interleaved and scrambled encoded CAC information unit is fed into DSP 130, where it is descrambled by descrambler 146 and deinterleaved by deinterleaver 148.

Encoded CAC information unit 400, which was originally generated at point 124 of base station 102, is now regenerated at a point 178 of mobile station 104. Unfortunately, however, encoded CAC information unit 400 may now contain bit errors.

Encoded CAC information unit 400 is fed into BCH FEC 150. In BCH FEC 150, BCH syndrome generator 156 generates, using the plurality of CAC data portions 402 and the plurality of BCH error correction codes 404, a plurality of BCH syndromes corresponding to the plurality of CAC data portions 402 (step 604). In general, each BCH syndrome may be generated by multiplying each CAC data portion and its corresponding BCH error correction code with the BCH generator matrix. Here, each of the plurality of BCH syndromes has a 4-bit length.

If a BCH syndrome has a non-zero value, it is very likely that the CAC data portion corresponding thereto has an error. On the other hand, if a BCH syndrome has a zero value, it is very likely that the CAC data portion corresponding thereto does not have an error. Multiple bit errors in a CAC data portion will typically cause a corresponding BCH syndrome to have a non-zero value, although if the multiple errors occur in particular locations, the BCH syndrome could still evaluate to zero.

Each BCH syndrome having a non-zero value uniquely defines the position of a single bit error in a corresponding CAC data portion. BCH error corrector 158 uses the plurality of BCH syndromes and a correction table (not shown) to correct a single error that may exist in each of the plurality of CAC data portions 402 (step 606). Thus, a post-correction CAC information unit having a plurality of post-correction CAC data portions are generated at a point 179. Some of the plurality of post-correction CAC data portions may be free from errors, some may have had errors that were corrected by BCH FEC 150, and some may still have errors that BCH FEC 150 was unable to correct. If multiple bit errors existed in a CAC data portion, BCH error corrector 158 may have in fact added an additional bit error by "correcting" a bit which was not actually in error.

The post-correction CAC information unit is fed into CRC error detector 152 to detect if errors exist therein. In CRC error detector 152, CRC error value generator 160 generates, using the plurality of post-correction CAC data portions, a CRC error-checking value (step 608). CRC comparator 162 compares the CRC error-checking value with CRC error detection code 304 (step 610). If the CRC error-checking value and the CRC error detection code 304 do not match (step 612), a CRC error indication is set in a CRC error indication word (step 614), signifying that an error exists in the plurality of post-correction CAC data portions. If there is a match at step 612, the CRC error indication is not set in the CRC error indication word.

Formatter 154, which receives the plurality of BCH syndromes from BCH syndrome generator 156, formats data of the plurality of post-correction CAC data portions, the CRC error indication word, and the plurality of BCH syndromes, and passes the result to microprocessor 132 through a line 180. The plurality of BCH error correction codes 404 and CRC error detection code 304 are not passed to microprocessor 132.

Figure 5:
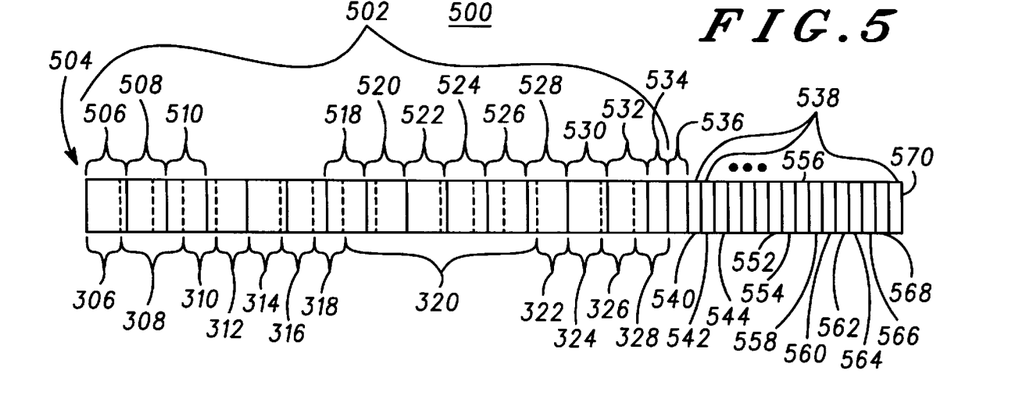
FIG. 5 is a visual representation of a post-correction CAC information unit having a CRC error indication word and a plurality of BCH syndromes appended thereto.

The resulting data at line 180 of FIG. 1 is data 500 as represented in FIG. 5. As described above and shown, data 500 comprise a post-correction CAC information unit 502 including a plurality of post-correction CAC data portions 504, followed by a CRC error indication word 536 and a plurality of BCH syndromes 538. Here, each of the plurality of post-correction CAC data portions 504 has a 10-bit length, CRC error indication word 536 has an 8-bit length, and each of the plurality of BCH syndromes 538 has a 4-bit length.

Most of the plurality of BCH syndromes 538 correspond to one of the plurality of post-correction CAC data portions 504. For example, a BCH syndrome 540 corresponds to a post-correction CAC data portion 506, a BCH syndrome 542 corresponds to a post-correction CAC data portion 508, a BCH syndrome 544 corresponds to a post-correction CAC data portion 510, etc. In addition, although CRC error detection code 304 is now unused, data 500 include a BCH syndrome 568 corresponding to a portion of CRC error detection code 304 and a BCH syndrome 570 corresponding to a remaining portion of CRC error detection code 304.

Referring back to FIGS. 1 and 6 in combination, error detector 174 reads CRC error indication word 536 (step 616) and tests if an error exists in post-correction CAC information unit 502 (step 618). If no errors exist therein, post-correction CAC information unit 502 is designated as a "good" unit (step 620) and passed to layer-1 processor 166 for further processing. Accordingly, layer-3 processor 170 of microprocessor 132 processes a function based on data of post-correction CAC information unit 502 (step 622).

Figure 7:
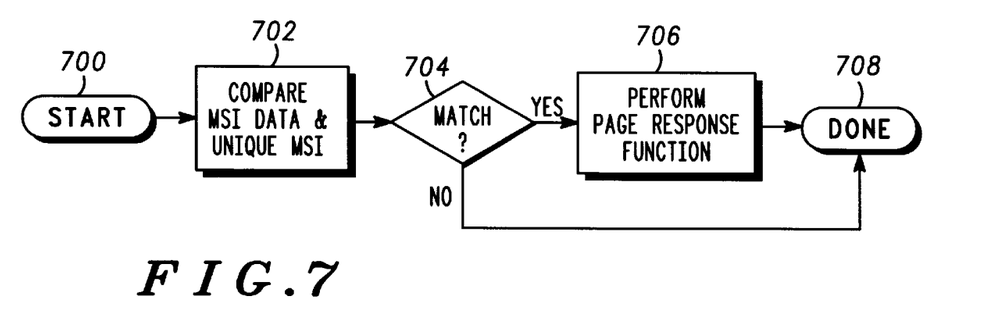
FIG. 7 is a flowchart of a method of performing a function which includes detecting a page in a paging message.

As described in the flowchart of FIG. 7, this function includes detecting a page and processing a page response function in response thereto. Starting at a start block 700, layer-3 processor 170 compares, using a comparison function, data of post-correction CAC data portions corresponding to CAC field 320 (i.e., MSI data) to the unique MSI data stored in memory 172 (step 702). If there is not a match (step 704), then a page is not received and processing is completed (step 708). If the MSI data and the unique MSI data match or are substantially the same, then layer-3 processor 170 responds by invoking a page response function (step 706).

The page response function includes providing an indication at user interface 144. For example, mobile station 104 may sound an alert signal through the speaker of user interface 144 and/or display a text message on the display of user interface 144. When a user of mobile station 104 hears and/or sees such an alert, the call may be answered and a two-way voice call may proceed. The page response function also includes transmitting a "terminating condition report" to base station 102, which includes sending data of post-correction CAC data portion 528 corresponding to CAC field 322 (i.e., the PIN data).

Referring back to steps 616 and 618 of FIG. 6, microprocessor 132 may read CRC error indication word 536 and determine that the CRC error indication is set. If so, error detector 174 tests if all BCH syndromes corresponding to post-correction CAC data portions of the substantially critical data are zero (step 626). More specifically, error detector 174 tests each of BCH syndromes 552, 554, 556, 558, 560, and 562 (which respectively correspond to post-correction CAC data portions 518, 520, 522, 524, 526, and 528, which correspond to CAC fields 320 and 322). In this step, error detector 174 is, in essence, detecting if at least a first post-correction CAC data portion is error-free or very likely to be error-free.

It is understood that a post-correction CAC data portion deemed "error-free" may not, in fact, be error-free due to the inherent limitations of error coding. It is also understood that a post-correction CAC data portion having a corresponding BCH syndrome with a non-zero value may in fact be error-free, where BCH FEC 150 has corrected all errors therein. Nonetheless, post-correction data portions having BCH syndromes with non-zero values may be herein regarded as "not error-free."

If BCH syndromes 552, 554, 556, 558, 560, and 562 are zero at step 626, and thus the substantially critical data are error-free, post-correction CAC information unit 502 is not discarded but is used for processing. Here, since CRC error detector 152 detected a CRC error, it is likely that an error exists in the substantially non-critical data. Thus, error corrector 176 corrects post-correction CAC data portions corresponding to the substantially non-critical data by substituting them with the correction data stored in memory 172 (step 630). Preferably, correction is performed only on post-correction CAC data portions that are tested by error detector 174 to have non-zero BCH syndromes.

The correction data may be data that are predetermined or expected, and may be somewhat arbitrary depending on the desired processing. Acceptable correction data for each post-correction CAC data portion are indicated above in relation to the description of the substantially non-critical data, and should be fully appreciated by one reasonably skilled in the art. In addition, correction data are described in more detail later in relation to FIG. 8.

Thereafter, post-correction CAC information unit 502 is regarded as a "good" unit (step 620) and acceptable to process. Microprocessor 132 processes a function, such as the function described above in relation to FIG. 7, based on at least a portion of post-correction CAC data portions that includes the substantially critical data (step 622). Here, as described above, microprocessor 132 uses at least the MSI data and the PIN data for processing the function.

At step 626, if the BCH syndromes corresponding to the substantially critical data do not have values of zero, and thus errors may exist in the substantially critical data, post-correction CAC information unit 502 is regarded as a "bad" unit (step 632) and is discarded. Here, microprocessor 132 does not process based on the data of post-correction CAC information unit 502 and discards the plurality of post-correction CAC data portions 504.

In conventional methods, if the CRC error indication is set at step 618, a path 638 is taken where post-correction CAC information unit 502 is regarded as a "bad" unit and is discarded (step 632). Thus, the use of conventional methods results in many lost messages and in low call completion rates due to post-correction CAC information units being discarded even when errors exist only in non-critical data.

Here, in the case where one mobile station is being paged in a paging message, the paging message can still be processed even where 10 out of 16 CAC data portions (62.5% of the data) are in error. By processing many paging messages which would otherwise be discarded, a mobile station increases the probability that it will process a paging message having an incoming call that is uniquely intended therefor. Thus, call completion rates are desirably increased by improving the decoding of paging messages. Decoder 164 is relatively easy to implement and requires no complex or time-consuming processing.

After receiving PCH subframes 204, receiver 136 will receive an encoded information unit of a next subframe of the plurality of subframes 202. This next encoded information unit will be processed similarly to, if not the same as, encoded CAC information unit 400 as described above.

However, the next encoded information unit may have a substantially predetermined format and data that are different from that of CAC information unit 300. Before such new processing begins, microprocessor 132 may assign new fields and new BCH syndromes which correspond to new substantially critical data of the next encoded information unit (step 634). Similarly, microprocessor 132 may assign new fields and new BCH syndromes which correspond to new substantially non-critical data of the next encoded information unit. These new assignments are used in relation to steps 626 and 630 for processing the next encoded information unit.

Microprocessor 132 may also assign new correction data for the next encoded information unit (step 636), which are used in relation to step 630 for correcting the substantially non-critical data of the next encoded information unit. Thus, error detector 174 and error corrector 176 may include parameters that change in response to which of the plurality of subframes 202 and particular data are being received.

For example, unused fields, such as CAC fields 324–328, may change from message to message. Thus, for each unit, it may be desirable to designate all "used fields" as including the substantially critical data and all "unused fields" as including the substantially non-critical data.

Some or most encoded information units may contain data that are all or mostly all substantially critical data. In these cases, all or mostly all of fields and syndromes of such unit are assigned or designated (at step 634) as including substantially critical data. Since it is likely that at least one syndrome will have a non-zero value when a CRC error is detected, such assignment has the effect of bypassing error detector 174 and error corrector 176 where an errored unit is discarded as in conventional methods.

For example, all of the plurality of CAC fields 305 may be designated to include substantially critical data, except for data corresponding to CRC error detection code 304 (corresponding to BCH syndrome 570) which are designated to include substantially non-critical data. In the situation where only data corresponding to CRC error detection code 304 are corrupted, a CRC error detection will result, where all of the plurality of BCH syndromes 538 except for BCH syndrome 570 are zero. Here, post-correction CAC information unit 502 is still processed even though a CRC error was detected.

Figure 8:
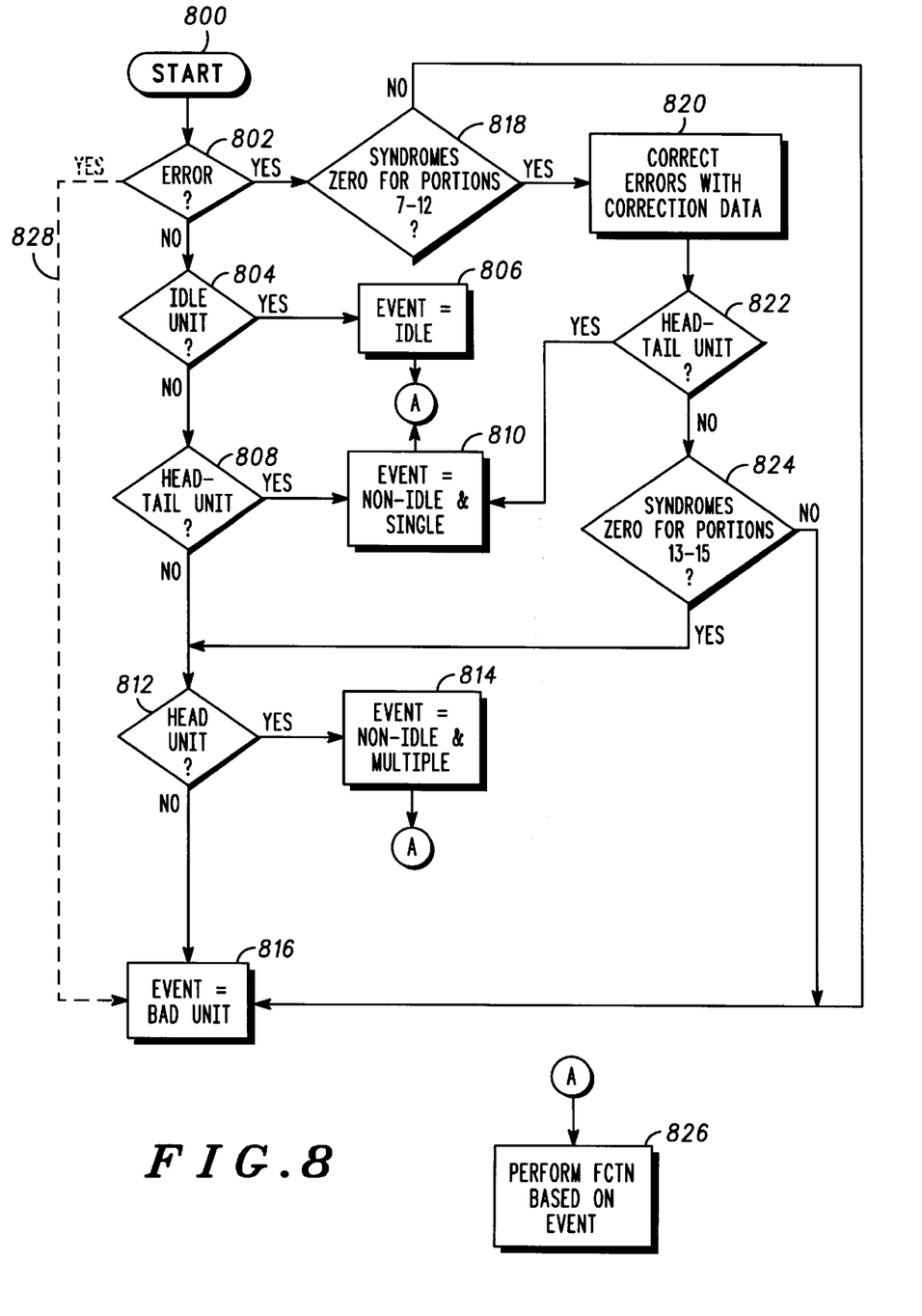
FIG. 8 is a second flowchart describing a method of detecting errors and decoding the encoded CAC information unit of FIG. 4.

FIG. 8 is a second flowchart of a method of decoding encoded CAC information unit 400, describing more specifically the lower-level processing involved due to the variable length of CAC information unit 300. Starting at a start block 800, error detector 174 reads CRC error indication word 536 to test if an error exists in the plurality of post-correction CAC data portions (step 802). If the error indication is not set, then post-correction CAC information unit 502 is regarded as error-free and is passed to layer-1 processor 166. Layer-1 processor 166 reads data of post-correction CAC information unit 502 corresponding to CAC field 306, which includes the W bits field, to test if CAC information unit 300 is an "idle" unit and essentially contains no useful information (step 804). Post-correction CAC information unit 502 is idle if post-correction data in the W bits field='00'. If it is an idle unit, layer-1 processor 166 designates the event to be an "idle" event (step 806). In response to an idle event, layer-3 processor 170 performs a null function (step 826).

If post-correction CAC information unit 502 is not idle at step 804 (i.e., the W bits are non-zero), layer-1 processor 166 tests if post-correction CAC information unit 502 is a "head-tail" unit (step 808). In general, a head-tail unit signifies that the current message consists of only a single CAC information unit. Post-correction CAC information unit 502 is a head-tail unit if data in the W bits field='01'. If it is a head-tail unit, layer-1 processor 166 designates the event to be a "non-idle and single unit" event (step 810). In response to a non-idle and single unit event, layer-3 processor 170 then performs a function based on post-correction CAC information unit 502.

If post-correction CAC information unit 502 is not a head-tail unit at step 808, layer-1 processor 166 tests if it is a "head" unit (step 812). In general, a head unit signifies that the incoming message consists of multiple units. Post-correction CAC information unit 502 is a head unit if data of the W bits field='10'. If it is a head unit, layer-1 processor 166 designates the event to be a "non-idle and multiple unit" event (step 814). In response to a non-idle and multiple unit event, layer-1 processor 166 knows that post-correction CAC information unit 502 is not, in itself, a complete message, and waits until further CAC information units are received before layer-3 processor 170 can process the message.

If data of the W bits field indicate none of the above-designated units, layer-1 processor 166 designates the event as a "bad unit" event (step 816).

At step 802, if the CRC error indication word 536 indicates that a CRC error exists, error detector 174 detects if BCH syndromes 552, 554, 556, 558, 560, and 562, which correspond to post-correction CAC data portions 518, 520, 522, 524, 526, and 528, have values of zero (step 818). Here, error detector 174 is essentially detecting if the substantially critical data are error-free. If any one of BCH syndromes 552, 554, 556, 558, 560, and 562 are non-zero, microprocessor 132 designates the event as a "bad unit" event (step 816).

If the substantially critical data are error-free at step 818, error corrector 176 corrects post-correction CAC data portions that may have errors (i.e., post-correction CAC data portions that have non-zero BCH syndromes) by substituting them with correction data (step 820). Preferred correction data are shown below:

| Field | Correction Data |
| --- | --- |
| CAC field 306 | $CE, if a single PCH subframe; or Head unit + number of remaining units, if non-single PCH subframe. |
| CAC field 308 | $11FF |
| CAC field 310 | $03 |
| CAC field 312 | $04 |
| CAC field 314 | $02 |
| CAC field 316 | $00 |
| CAC field 318 | $0 (upper four bits) |
| CAC fields 324, 326, 328 | if CAC field 318 is 0 or 1, set to $000000 |

Once post-correction CAC information unit 502 has been corrected by error corrector 176 at step 820, layer-1 processor 166 tests if it is a head-tail unit (step 822). If it is a head-tail unit, layer-1 processor 166 designates the event to be a "non-idle and single unit" event (step 810). In response to a non-idle and single unit event, microprocessor 132 knows that post-correction CAC information unit 502 is, in itself, a complete message, and layer-3 processor 170 performs a function based on post-correction CAC information unit 502 (step 826).

If it is not a head-tail unit at step 822, error detector 174 detects if BCH syndromes 564, 566, and 568, which correspond to post-correction CAC data portions 530, 532, and 534, have values of zero (step 824). That is, error detector 174 detects if an additional set of substantially critical data are error-free. If any one of BCH syndromes 564, 566, and 568 are non-zero, error detector 174 designates the event as a "bad unit" event (step 816) and post-correction CAC information unit 502 is discarded. If BCH syndromes 564, 566, and 568 are all non-zero, post-correction CAC information unit 502 is not discarded and microprocessor 132 continues processing at step 812 as described above.

In the prior art, if a CRC error was detected at step 802, a path 828 was taken where the event was designated as a "bad unit" event at step 816, and post-correction CAC information unit 502 was discarded. Using the methods described herein, more messages are reliably decoded and processed.

Any suitable function may be performed in response to detecting in accordance with the present invention. For example, a function for reducing a power consumption of mobile station 104 may be performed, as in intermittent receive (IRX) related functions. Such methods typically depend on system specifications. In conception, if a message or portion thereof is received having errors, it cannot be processed and reception typically must be continued. If a message or portion thereof is received without errors, it can be processed and reception can typically be discontinued.

Applied more particularly here, consider a PDC system where base station 102 is configured to always transmit non-idle messages in a first subframe of PCH subframes 204 when paging information is available. Conversely here, base station 102 always transmits idle messages in the first subframe when paging information is unavailable. Such predictability in message communication allows a mobile station to reduce its power consumption in the case where base station 102 configures superframe 200 for multiple PCH subframes. A post-correction information unit is detected to be in error by CRC error detector 152. Error detector 174 detects whether BCH syndrome 540, which corresponds to CAC field 306 (i.e., the W Bits field), has a value of zero. If BCH syndrome 540 has a value of zero, data corresponding to the W Bits field is compared to zero. If a match exists, then the paging message is idle, and a receiver and other electrical circuitry may be powered off for a next receive slot of PCH subframe 204 (and other remaining PCH subframes) of superframe 200. In Advanced Mobile Phone Systems (AMPS) and similar systems where repeat words are utilized, a receiver and other electrical circuitry may be powered off for a remaining portion of repeat words or message after receiving and processing a repeat word or a portion thereof which is detected to be error-free as described herein. Thus, IRX methods and processes, which are well-known in the art, may be used in conjunction with such detection to thereby reduce power consumption of a mobile station.

While particular embodiments of the present invention have been shown and described, modifications may be made. For example, the decoding and processing described herein may be applied to any suitable radio communication device and RF communication system. In addition, any suitable type of error detection and error correction codes may be used, such as suitable parity codes, block codes, cyclical codes, and convolutional codes. This, of course, would include corresponding suitable error correction code generators and error detection code generators in a transmitting device, and suitable error correctors, syndrome generators, and error detectors in a receiving device. Also, although CAC information data, CAC information units, CAC data portions, and post-correction CAC data portions are described herein, other information data, information units, data portions, and post-correction data portions may be decoded and processed in the same or similar manner. Although the use of software in DSP 130 and microprocessor 132, as described, is preferred, suitable hardware implementations may be used as well.

It is therefore intended in the appended claims to cover all such changes and modifications which fall within the true spirit and scope of the invention.

What is claimed is:

1. An apparatus for decoding a message, the message including information data mapped to an error detection code and divided into a plurality of data portions mapped to a plurality of error correction codes, said apparatus comprising:

a first error corrector, said first error corrector operative to generate a plurality of syndromes corresponding to the plurality of data portions and operative to correct at least one error in each of the plurality of data portions to thereby generate a plurality of post-correction data portions;

a first error detector, said first error detector operative to detect an error in the plurality of post-correction data portions; and a second error detector, said second error detector operative to detect that at least a first post-correction data portion is error-free by testing at least a first syndrome corresponding to the at least a first post-correction data portion.

2. The apparatus according to claim 1, wherein said second error detector is operative to detect that at least a first post-correction data portion is error-free in response to said first error detector detecting the error in the plurality of post-correction data portions.

3. The apparatus according to claim 1, wherein said second error detector is operative to detect that the at least a first post-correction data portion is error-free by detecting that the at least a first syndrome has a value of zero.

4. The apparatus according to claim 1, wherein the at least a first post-correction data portion includes substantially critical data and at least a second post-correction data portion includes substantially non-critical data.

5. The apparatus according to claim 4, wherein the at least a first post-correction data portion includes one of substantially significant data, substantially unpredictable data, and both substantially significant and unpredictable data, and wherein the at least a second post-correction data portion includes one of substantially insignificant data, substantially predictable data, and both substantially insignificant and predictable data.

6. The apparatus according to claim 1, further comprising:

a function processor, said function processor operative to perform a function in response to said second error detector.

7. The apparatus according to claim 1, further comprising:

a function processor, said function processor operative to perform a function in response to said first error detector detecting that an error exists in the plurality of post-correction data portions and said second error detector detecting that the at least a first post-correction data portion is error-free, the function based on data of the at least a first post-correction data portion.

8. The apparatus according to claim 1, said apparatus further comprising:

a second error corrector responsive to said second error detector, said second error corrector operative to substitute data of at least a second post-correction data portion with correction data.

9. The apparatus according to claim 1, wherein the plurality of error correction codes comprises a plurality of Bose-Chaudhuri-Hocquenghem (BCH) error correction codes and the error detection code comprises a cyclical redundancy check (CRC) error detection code, and wherein said first error corrector comprises a BCH forward error corrector (FEC) and said first error detector comprises a CRC error detector.

10. A radio communication device operative to decode an encoded information unit, the encoded information unit including information data mapped to an error detection code and divided into a plurality of data portions mapped to a plurality of error correction codes, said radio communication device comprising:

a first error corrector, said first error corrector operative to generate a plurality of syndromes corresponding to the plurality of data portions and operative to correct at least one error in each of the plurality of data portions using the plurality of syndromes to thereby generate a plurality of post-correction data portions;

a first error detector, said first error detector operative to detect an error in the plurality of post-correction data portions;

a second error detector, said second error detector operative to detect that at least a first syndrome corresponding to at least a first post-correction data portion has a zero value; and a function processor, said function processor operative to perform a function that utilizes data of the at least a first post-correction data portion in response to said first error detector detecting the error in the plurality of post-correction data portions and said second error detector detecting the zero value of the at least a first syndrome.

11. The radio communication device according to claim 10, wherein the radio communication device further includes a user interface, and wherein said function processor is operative to perform a function providing an indication at said user interface.

12. The radio communication device according to claim 10, wherein the radio communication device further includes a receiver, and wherein said function processor is operative to perform a function for powering down said receiver.

13. The radio communication device according to claim 10, wherein the at least a first post-correction data portion includes substantially critical data and at least a second post-correction data portion includes substantially non-critical data.

14. The radio communication device according to claim 10, wherein the at least a first post-correction data portion includes data that uniquely identifies a communication device and said radio communication device has unique identification data, and wherein said function processor is operative to perform a function that includes a comparison function and a page response function, the comparison function comparing data of the at least a first post-correction data portion and the unique identification data, the page response function performed in response to the data of the at least a first post-correction data portion and the unique identification data being substantially the same.

15. A radio communication device operative to decode a message in a communication system, the message including information data divided into a plurality of data portions mapped to a plurality of error correction codes, said radio communication device comprising:

a first error corrector, said first error corrector operative to generate a plurality of syndromes corresponding to the plurality of data portions and operative to correct at least one error in each of the plurality of data portions using the plurality of syndromes to thereby generate a plurality of post-correction data portions; and a first error detector, said first error detector operative to designate at least a first post-correction data portion to have substantially critical data and at least a second post-correction data portion to have substantially non-critical data, said first error detector operative to detect that the at least a first post-correction data portion is error-free by testing at least a first syndrome corresponding thereto.

16. The radio communication device according to claim 15, wherein the information data further includes an error detection code, said radio communication device further comprising:

a second error detector, said second error detector operative to detect, using the error detection code, an error in the plurality of post-correction data portions.

17. The radio communication device according to claim 15, wherein said first error detector is operative to detect that at least a second post-correction data portion is error-free by testing at least a second syndrome corresponding thereto, said radio communication device further comprising:

a second error corrector, said second error corrector operative to substitute data of the at least a second post-correction data portion with correction data in response to said first error detector detecting that the at least a second post-correction data portion is not error-free.

18. The radio communication device according to claim 16, wherein the plurality of error correction codes includes a plurality of Bose-Chaudhuri-Hocquenghem (BCH) error correction codes and the error detection code includes a cyclical redundancy check (CRC) error detection code, and wherein said first error corrector comprises a BCH forward error corrector (FEC) and said second error detector comprises a CRC error detector.

19. The radio communication device according to claim 15, wherein said first error detector is operative to designate at least a first post-correction data portion to have substantially critical data when the at least a first post-correction data portion includes one of substantially significant data, substantially unpredictable data, or both substantially significant and unpredictable data, and wherein said first error detector is operative to designate at least a second post-correction data portion to have substantially non-critical data when the at least a second post-correction data portion includes one of substantially insignificant data, substantially predictable data, or both substantially insignificant and predictable data.

20. The radio communication device according to claim 15, further comprising:

a function processor, said function processor operative to perform a function in response to said first error detector, where the function is based on data of the at least a first post-correction data portion.

21. The radio communication device according to claim 15, wherein the at least a first post-correction data portion includes data that uniquely identifies a communication device, said radio communication device further comprising:

a memory, said memory having unique identification data stored therein; and a function processor, said function processor operative to compare the unique identification data and data of the at least a first post-correction data portion, said function processor operative to perform a page response function in response to the data of the at least a first post-correction data portion and the unique identification data being substantially the same.

22. A method of processing a message in a radio communication device, the message including information data mapped to an error detection code and divided into a plurality of data portions mapped to a plurality of error correction codes, the method comprising the steps of:

generating, from the plurality of data portions and the plurality of error correction codes, a plurality of syndromes;

correcting, using the plurality of syndromes, at least one error in at least one of the plurality of data portions, thereby generating a plurality of post-correction data portions;

detecting, using the error detection code, an error in the plurality of post-correction data portions;

detecting a zero value of at least a first syndrome corresponding to at least a first post-correction data portion; and performing a function that utilizes data of the at least a first-post correction data portion in response to detecting the error in the plurality of post-correction data portions and the zero value of the at least a first syndrome.

23. The method according to claim 22, wherein the step of detecting a zero value further comprises the step of:

determining that the at least a first post-correction data portion includes substantially critical data.

24. The method according to claim 22, wherein the radio communication device includes unique identification data and the at least a first post-correction data portion includes data that uniquely identifies a communication device, and wherein the step of performing a function further comprises the steps of:

comparing the unique identification data and the data of the at least a first post-correction data portion; and performing a page response function in response to the step of comparing.

25. The method according to claim 22, wherein the step of performing a function comprises the step of powering down a portion of electrical circuitry of the radio communication device.

26. The method according to claim 22, wherein the step of performing a function comprises the step of powering down a receiver of the radio communication device.

27. The method according to claim 22, wherein the error detection code includes a cyclical redundancy check (CRC) error detection code and the plurality of error correction codes includes a plurality of Bose-Chaudhuri-Hocquenghem (BCH) error correction codes, and wherein the step of generating a plurality of syndromes further includes the step of generating a plurality of BCH syndromes.

28. A mobile station operative to decode a paging message, the paging message including an encoded common access channel (CAC) information unit of a paging channel (PCH) subframe, the encoded CAC information unit including CAC information data mapped to a cyclical redundancy check (CRC) error detection code and divided into a plurality of CAC data portions mapped to a plurality of Bose-Chaudhuri-Hocquenghem (BCH) error correction codes, the CAC information data having a Mobile Station Identifier (MSI) field and a Paging ID Number (PIN) field, said mobile station having unique MSI data stored therein, said mobile station comprising:

a BCH forward-error corrector (FEC), said BCH FEC operative to generate, from the plurality of CAC data portions and the plurality of BCH error correction codes, a plurality of BCH syndromes, said BCH FEC operative to correct, using the plurality of BCH syndromes, at least one error in each of the plurality of CAC data portions to thereby generate a plurality of post-correction CAC data portions;

a CRC error detector, said CRC error detector operative to detect, using the CRC error detection code, an error in the plurality of post-correction CAC data portions;

an error detector, said error detector operative to detect if BCH syndromes corresponding to substantially critical data of the plurality of post-correction CAC data portions have values of zero, the substantially critical data including post-correction CAC data portions corresponding to the MSI field and the PIN field; and a function processor, said function processor responsive to said CRC error detector detecting the error and said error detector detecting that the BCH syndromes corresponding to the substantially critical data have values of zero, said function processor operative to compare the unique MSI data of said mobile station and MSI data of post-correction CAC data portions corresponding to the MSI field, said function processor operative to perform a page response function in response to the unique MSI data and the MSI data being substantially the same.

29. The mobile station according to claim 28, wherein the CAC information data includes a W Bits field, and wherein the substantially critical data further includes data of a post-correction CAC data portion corresponding to the W Bits field.

30. The mobile station according to claim 29, wherein the CAC information data includes a Number of Paging Mobile Stations (NPMS) field, and wherein the substantially critical data further includes post-correction CAC data portions corresponding to the NPMS field.

31. A mobile station, comprising:

a receiver, said receiver operative to receive a message, the message including information data mapped to an error detection code and divided into a plurality of data portions mapped to a plurality of error correction codes;

a digital signal processor (DSP) coupled to said receiver, said DSP having:

a first error corrector, said first error corrector operative to generate a plurality of syndromes and operative to correct, using the plurality of syndromes, at least one error in each of the plurality of data portions to thereby generate a plurality of post-correction data portions;

a first error detector, said first error detector operative to detect an error in the plurality of post-correction data portions and to generate an error indication corresponding thereto; and a microprocessor coupled to said DSP, said microprocessor having:

a second error detector, said second error detector operative to receive the error indication and at least one of the plurality of syndromes.

32. The mobile station according to claim 31, wherein said microprocessor is operative to perform a function that utilizes data of at least one of the plurality of post-correction data portions corresponding to the at least one of the plurality of syndromes in response to said second error detector.

33. The mobile station according to claim 31, wherein said microprocessor is operative to perform a function in response to said first error detector indicating that an error exists in the plurality of post-correction data portions and said second error detector detecting that at least a first syndrome corresponding to at least a first post-correction data portion has a value of zero, the function utilizing data of the at least a first post-correction data portion.

34. The mobile station according to claim 32, wherein the plurality of error correction codes includes a plurality of Bose-Chaudhuri-Hocquenghem (BCH) codes and the error detection code includes a cyclical redundancy check (CRC) code, and wherein said first error corrector comprises a BCH forward error corrector (FEC) and said first error detector comprises a CRC error detector.

35. A radio frequency (RF) communication system, comprising:

a base station, including:
  at least a first processor having:
    an error detection code generator, said error detection code generator operative to generate an error detection code corresponding to information data;
    an error correction code generator, said error correction code generator operative to generate a plurality of error correction codes corresponding to a plurality of data portions of the information data and the error detection code;
  a transmitter coupled to said at least a first processor, said transmitter operative to transmit an encoded information unit that includes the information data, the error detection code, and the plurality of error correction codes;

a mobile station, including:
  a receiver, said receiver operative to receive the encoded information unit;
  at least a second processor coupled to said receiver, said at least a second processor having:
    a syndrome generator, said syndrome generator operative to generate a plurality of syndromes;
    a first error corrector, said first error corrector operative to correct, using the plurality of syndromes, at least one error in each of the plurality of data portions to thereby generate a plurality of post-correction data portions;
    a first error detector, said first error detector operative to detect, using the error detection code, an error in the plurality of post-correction data portions; and
    a second error detector, said second error detector operative to detect that at least a first post-correction data portion is error-free by testing at least a first syndrome corresponding to the at least a first post-correction data portion.

36. The RF communication system according to claim 35, wherein said second error detector is operative to detect that the at least a first post-correction data portion is error-free by detecting that the at least a first syndrome corresponding to the at least a first post-correction data portion has a zero value.

37. The RF communication system according to claim 35, wherein said RF communication system operates in accordance with Research and Development for Radio Systems (RCR) STD-27.

38. The RF communication system according to claim 35, wherein said at least a second processor includes a digital signal processor (DSP) and a microprocessor, said DSP includes processes for performing functions of said syndrome generator, said first error corrector, and said first error detector, and said microprocessor includes a process for performing functions of said second error detector.

* * * * *